US008183911B2

(12) United States Patent
Kundu et al.

(10) Patent No.: US 8,183,911 B2
(45) Date of Patent: May 22, 2012

(54) HIGH VOLTAGE TOLERANCE OF EXTERNAL PAD CONNECTED MOS IN POWER-OFF MODE

(75) Inventors: Somnath Kundu, West Bengal (IN); Pikul Sarkar, West Bengal (IN); Nitin Gupta, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 94 days.

(21) Appl. No.: 12/581,578

(22) Filed: Oct. 19, 2009

(65) Prior Publication Data

US 2011/0090002 A1 Apr. 21, 2011

(51) Int. Cl.
*G11C 5/14* (2006.01)
(52) U.S. Cl. ........................ 327/530; 327/407
(58) Field of Classification Search .............. 327/538, 327/540, 541, 543, 407, 408, 427, 437, 530
See application file for complete search history.

(56) References Cited

U.S. PATENT DOCUMENTS

| 6,060,918 | A   | * | 5/2000  | Tsuchida et al. | 327/143 |
| 6,566,935 | B1  | * | 5/2003  | Renous          | 327/408 |
| 6,914,476 | B2  | * | 7/2005  | Ingino, Jr.     | 327/540 |
| 7,053,690 | B2  | * | 5/2006  | Utsuno          | 327/407 |
| 7,138,855 | B2  | * | 11/2006 | Herz et al.     | 327/543 |
| 7,362,148 | B2  | * | 4/2008  | Okitsu          | 327/110 |

* cited by examiner

*Primary Examiner* — Quan Tra
(74) *Attorney, Agent, or Firm* — Gardere Wynne Sewell LLP

(57) ABSTRACT

An integrated circuit includes a number of pads. The integrated circuit further includes a cascode transistor having an open drain connection to a first one of the pads. A bias generator circuit is included in the integrated circuit. The bias generator circuit has an output connected to a gate terminal of the cascode transistor. In a first mode of operation, the bias generator outputs a bias signal that is derived from an integrated circuit supply voltage present at a second one of the pads. However, in a second mode of operation provided when the integrated circuit supply voltage is not present, the bias generator generates the bias signal derived from a voltage present at the first one of the pads.

18 Claims, 2 Drawing Sheets

HIGH VOLTAGE TOLERANCE OF EXTERNAL PAD CONNECTED MOS IN POWER-OFF MODE

BACKGROUND OF THE INVENTION

1. Technical Field of the Invention

The present invention relates to the generation of a control voltage for a cascode transistor in an open drain transmitter configuration and, more specifically, to the generation of such a control voltage in a power-off condition to address reliability issues.

2. Description of Related Art

Reference is made to FIG. 1 which shows a circuit diagram of a prior art open drain transmitter configuration. A first pad 10 of a transmitter integrated circuit 12 is connected to a termination voltage Vterm through an external termination resistor 14. The integrated circuit 12 includes a cascode MOS transistor 16 (for example, of the NMOS-type) having its drain connected to the first pad 10 in an open-drain configuration. The source of the cascode MOS transistor 16 is connected to a second pad 18 (for example, a ground reference voltage pad) of the integrated circuit 12 through a current switch 20. The gate of the cascode MOS transistor 16 receives a reference (bias) voltage Vref which is derived by a bias generator 22 from an integrated circuit supply voltage Vsup received at a third pad 24. The reference (bias) voltage Vref is equal to or less than the supply voltage Vsup.

A concern exists with respect to this prior art circuit configuration when the transmitter integrated circuit 12 is not powered by the supply voltage Vsup at the third pad 24 but the termination voltage Vterm remains present. Such might occur, for example, in a situation where power is shut off to transmitter integrated circuit 12 but a receiver circuit associated with the termination voltage Vterm continues to be powered. In such a case, the reference (bias) voltage Vref at pad 24 falls to zero and the voltage gate-to-drain and voltage drain-to-source for the cascode MOS transistor 16 will equal the termination voltage Vterm. If the termination voltage Vterm exceeds an absolute maximum rating (AMR) of the cascode MOS transistor 16, then issues concerning transmitter integrated circuit 12 reliability can arise.

In technologies where oxide thickness is usually large enough, the oxide reliability of a cascode MOS transistor in an open drain transmitter configuration is not of major concern. The reason for this is that the fabricated transistor typically can tolerate voltages associated with the termination voltage Vterm. However, in the technologies where the oxide is thinner, concerns with oxide reliability arise because open drain MOS transistors in an off condition typically cannot take voltages across their terminals in excess of the integrated circuit supply voltage Vsup. If the termination voltage Vterm exceeds the integrated circuit supply voltage Vsup, there is a risk that the open drain MOS transistor in an off condition will be damaged.

A need exists in the art to address the foregoing problem.

SUMMARY OF THE INVENTION

In an embodiment, a circuit comprises: a cascode MOS transistor having a drain connected to a first integrated circuit pad; and a bias generator circuit generating a bias voltage for application to a gate of the cascode MOS transistor, the bias generator having a first supply voltage input coupled to an integrated circuit supply voltage input and a second supply voltage input coupled to a voltage input at the first pad of the integrated circuit.

In another embodiment, a circuit comprises: an integrated circuit including a plurality of pads, the integrated circuit comprising: a cascode transistor having a conduction terminal connected to a first one of the plurality of pads; and a bias generator circuit having an output connected to a control terminal of the cascode transistor, the bias generator circuit having a first mode of operation wherein a bias signal at the output is derived from an integrated circuit supply voltage present at a second one of the plurality of pads and further having a second mode of operation wherein the bias signal at the output is derived from a voltage present at the first one of the plurality of pads.

In another embodiment, a method comprises: generating a bias signal for application to a control terminal of a transistor having a conduction terminal connected to a first one of a plurality of integrated circuit pads; wherein generating comprises: generating the bias signal from a integrated circuit supply voltage received at a second one of the plurality of integrated circuit pads; and generating the bias signal from a pad voltage at the first one of the plurality of integrated circuit pads in the absence of the integrated circuit supply voltage at the second one of the plurality of integrated circuit pads.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
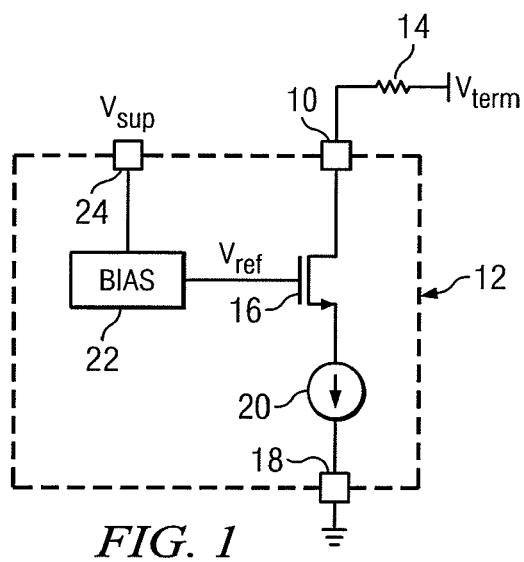
FIG. 1 is a circuit diagram of a prior art open drain transmitter configuration.
Figure 2:
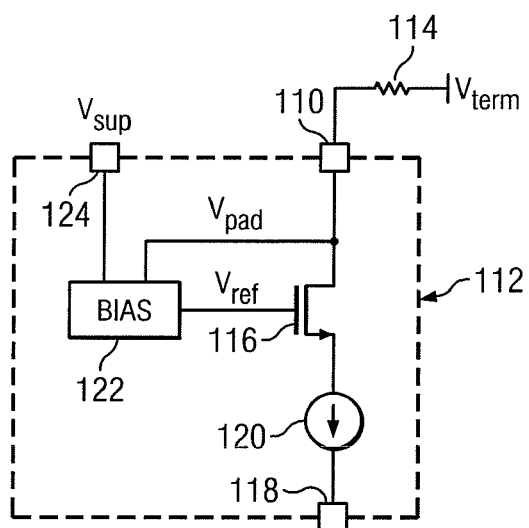
FIG. 2 is a circuit diagram of an open drain transmitter configuration with a bias generator.

Reference is now made to FIG. 2 which shows a circuit diagram of an open drain transmitter configuration. A first pad 110 of a transmitter integrated circuit 112 is connected to a termination voltage Vterm through an external termination resistor 114. The integrated circuit 112 includes a cascode MOS transistor 116 (for example, of the NMOS-type) having its drain connected to the first pad 110 in an open-drain configuration. The source of the cascode MOS transistor 116 is connected to a second pad 118 (for example, a ground reference voltage pad) of the integrated circuit 112 through a current switch 120. The gate of the cascode MOS transistor 116 receives a reference (bias) voltage Vref generated by a bias generator 122 circuit. The bias generator 122 is connected to receive as a first supply voltage an integrated circuit supply voltage Vsup received at a third pad 124. The bias generator 122 is further connected to receive as a second supply voltage the pad voltage Vpad present at the first pad 110. The reference (bias) voltage Vref is generated by the bias generator 122 at a bias output from either the first supply voltage Vsup or the second supply pad voltage Vpad depending on whether the circuit senses the presence of the first supply voltage Vsup.

Figure 3:
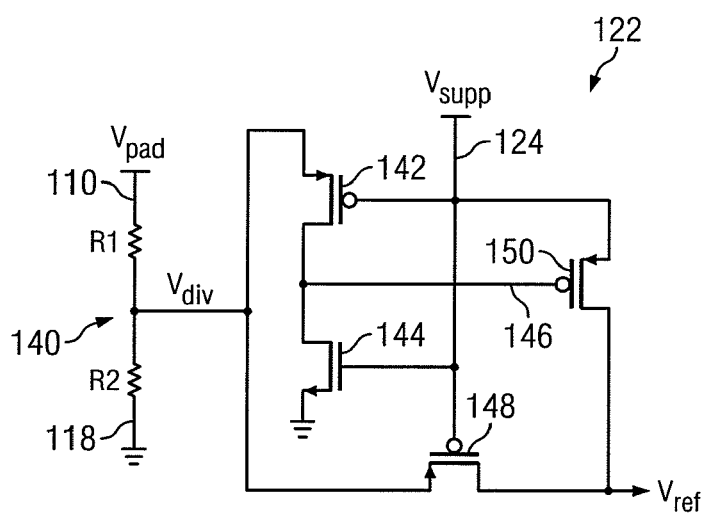
FIG. 3 is a circuit diagram of the bias generator used by the circuit of FIG. 2.

Reference is now made to FIG. 3 which shows a circuit diagram of the bias generator 122 used by the circuit of FIG. 2. The bias generator 122 includes a resistive divider 140 formed from series connected resistors R1 and R2 outputting a divided voltage Vdiv. The resistive divider is connected between the pad 110 (with second supply pad voltage Vpad) and the pad 118 (with a ground reference voltage). A series first PMOS transistor 142 and first NMOS transistor 144 are coupled between the divided voltage Vdiv and the pad 118 (with a ground reference voltage). Specifically, a source of the first PMOS transistor 142 receives the divided voltage Vdiv. The drains of the first PMOS transistor 142 and first NMOS transistor 144 are connected together at node 146. The gates of the first PMOS transistor 142 and first NMOS transistor 144 are coupled to receive the integrated circuit supply voltage Vsup from third pad 124. A second PMOS transistor 148 is coupled between the divided voltage Vdiv and the bias output supplying the reference (bias) voltage Vref. Specifically, the source of second PMOS transistor 148 is connected to the divided voltage Vdiv and the drain of the second PMOS transistor 148 is connected to the reference (bias) voltage Vref output. A third PMOS transistor 150 is coupled between the integrated circuit supply voltage Vsup at third pad 124 and the bias output supplying the reference (bias) voltage Vref. Specifically, the source of third PMOS transistor 150 is connected to the third pad 124 and the drain of the third PMOS transistor 150 is connected to the reference (bias) voltage Vref output.

The bias generator 122 operates as follows: if the integrated circuit supply voltage Vsup is present at third pad 124, first PMOS transistor 142 and second PMOS transistor 148 are turned off and first NMOS transistor 144 is turned on. This drives node 146 to ground and turns on third PMOS transistor 150 connecting the third pad 124 to the reference (bias) voltage Vref output. Thus, the output reference (bias) voltage Vref from bias generator 122 in this mode is derived from the integrated circuit supply voltage Vsup present at third pad 124. However, if the integrated circuit supply voltage Vsup is not present at third pad 124, first PMOS transistor 142 and second PMOS transistor 148 are turned on and first NMOS transistor 144 is turned off. This isolates the reference (bias) voltage Vref output from the integrated circuit supply voltage Vsup at third pad 124 and connects the reference (bias) voltage Vref output to the divided voltage Vdiv. Thus, the output reference (bias) voltage Vref from bias generator 122 in this mode is derived from the divided voltage Vdiv obtained from the pad voltage Vpad at pad 110.

The values of resistors R1 and R2 in the resistive divider 140 are chosen to set the output reference (bias) voltage Vref in the absence of an integrated circuit supply voltage Vsup at third pad 124. There is continuous current flow through these resistors from the third pad 124 so it is preferred that the resistance be high. Furthermore, care should be taken in choosing the values of resistors R1 and R2 so that the divided voltage Vdiv is less than a minimum integrated circuit supply voltage Vsup in view of a possible pad voltage Vpad at pad 110 (due to the termination voltage Vterm).

The first PMOS transistor 142 and first NMOS transistor 144 perform a voltage sensing function and operate as a kind of inverter circuit with the integrated circuit supply voltage Vsup as an input. In normal operating mode, the divided voltage Vdiv is always less than the integrated circuit supply voltage Vsup, so the output of the inverter circuit is the ground reference. However, when the integrated circuit supply voltage Vsup is not present, the output of the inverter circuit is the divided voltage Vdiv (thus turning off transistor 150, while the absence of Vsupp turns on transistor 148). Although not specifically illustrated in FIG. 3, the bulk of the first PMOS transistor 142 is preferably connected to the reference (bias) voltage Vref output.

Although not specifically illustrated in FIG. 3, the bulk of second PMOS transistor 148 should be connected to the drain of the second PMOS transistor 148. When the integrated circuit supply voltage Vsup is not present, the second PMOS transistor 148 is turned on and the output reference (bias) voltage Vref equals the divided voltage Vdiv.

Although not specifically illustrated in FIG. 3, the bulk of third PMOS transistor 150 should be connected to the drain of the third PMOS transistor 150. When the integrated circuit supply voltage Vsup is present, the third PMOS transistor 150 is turned on and the output reference (bias) voltage Vref equals the integrated circuit supply voltage Vsup.

Figure 4:
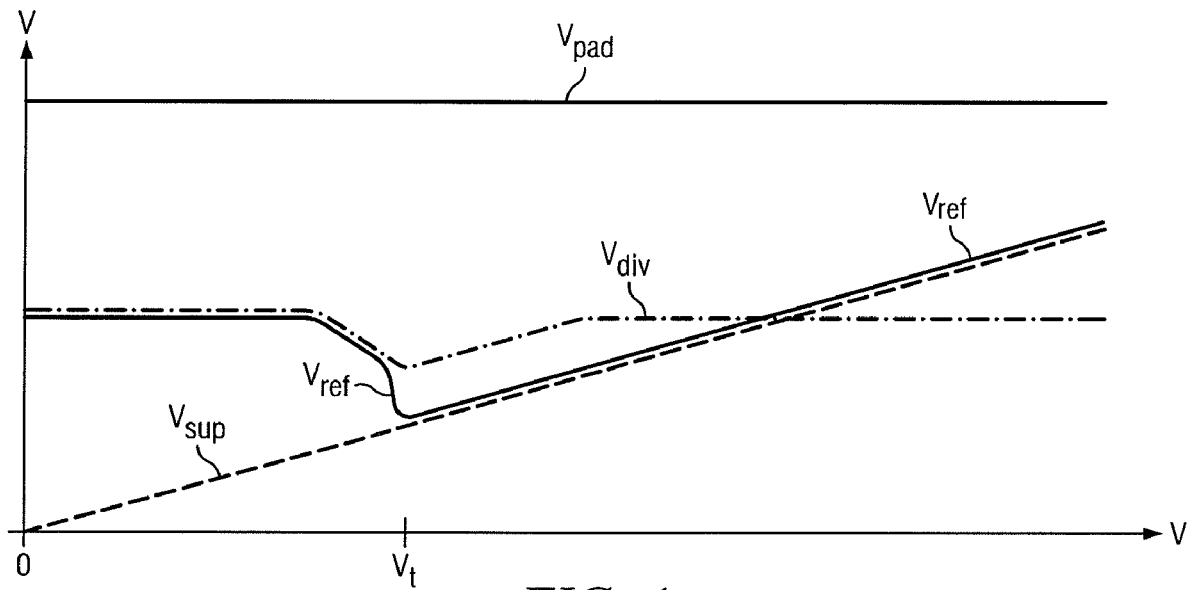
FIG. 4 illustrates a simulation result for a sweeping of the integrated circuit supply voltage applied to the circuit of FIGS. 2 and 3.

Reference is now made to FIG. 4 which illustrates a simulation result for a sweeping of the integrated circuit supply voltage for the circuit of FIGS. 2 and 3. For integrated circuit supply voltage Vsup values above threshold Vt, the output reference (bias) voltage Vref tracks the integrated circuit supply voltage Vsup. For integrated circuit supply voltage Vsup values below threshold Vt, however, the output reference (bias) voltage Vref tracks the divided voltage Vdiv. The drop of the divided voltage Vdiv for values of the integrated circuit supply voltage Vsup values near threshold Vt is caused by conduction through both the first PMOS transistor 142 and second PMOS transistor 148 (when both are partially on due to the integrated circuit supply voltage Vsup).

Figure 5:
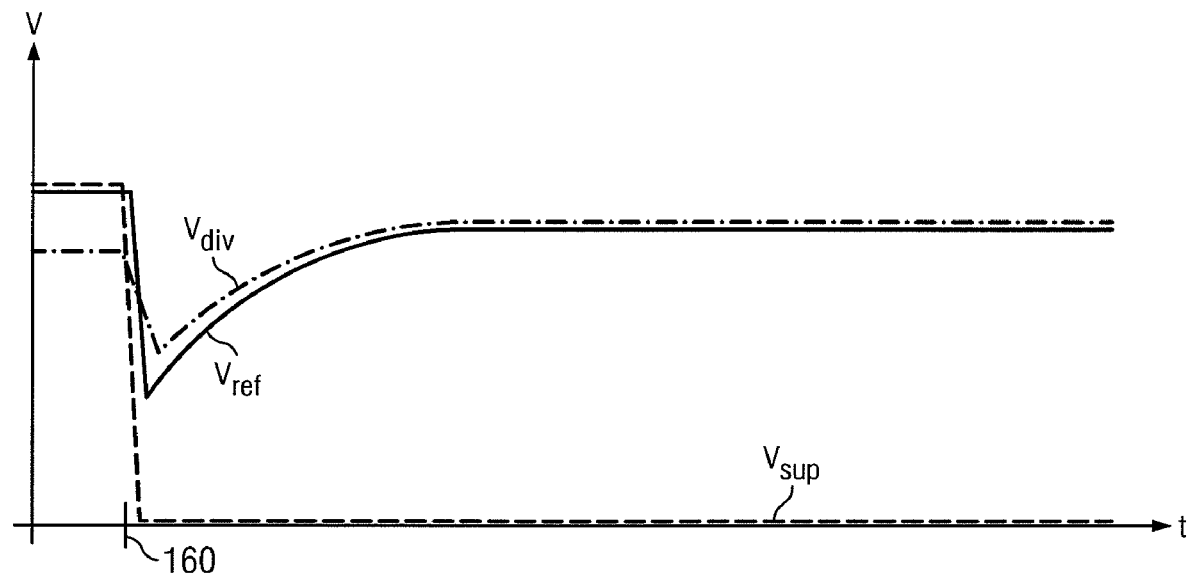
FIG. 5 illustrates a simulation result for when the integrated circuit supply voltage applied to the circuit of FIGS. 2 and 3 becomes floating.

Reference is now made to FIG. 5 which illustrates a simulation result for when the integrated circuit supply voltage becomes floating (as would be the case when the integrated circuit 112 is truly in power-off). In this simulation, a resistance is connected between integrated circuit supply voltage Vsup pad 124 and ground to take effect of leakage. In accordance with the simulation, the output reference (bias) voltage Vref is equal to integrated circuit supply voltage Vsup when such voltage is present. However, after point 160 in time, the integrated circuit supply voltage Vsup is removed and becomes floating eventually leaking to ground. The output reference (bias) voltage Vref then becomes equal to the divided voltage Vdiv.

The circuit disclosed herein has a number of advantages over the identified prior art circuit including: driver MOS reliability is improved in case of power-off; there no extra consumption on the integrated circuit power supply voltage; and the circuit can be used in any kind of open drain transmitter configuration where an external pull-up to an independent voltage is present.

To summarize, the circuit disclosed herein functions in a normal operating condition (when the integrated circuit supply voltage Vsup is present) to generate a cascode MOS transistor gate voltage derived from Vsup. However, the circuit further functions in a power-off condition (when the integrated circuit supply voltage Vsup is not present) to generate a cascode MOS transistor gate voltage derived from the open drain pad voltage. In either mode of operation, the cascode MOS transistor is controlled so reliability is not at issue.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
   a cascode MOS transistor having an open drain output configured to be coupled through a first integrated circuit output pad and terminating resistance to a terminating voltage supply and having a source node;
   a current switching device connected in series with the source node of the cascode MOS transistor;
   a bias generator circuit configured to generate a bias voltage for application to a gate of the cascode MOS transistor, the bias generator having a first supply voltage input configured to be coupled through a second integrated circuit pad to an integrated circuit voltage supply different from the terminating voltage supply and having a second supply voltage input different from the first supply voltage input coupled to receive a voltage present at the open drain output of the cascode MOS transistor;
   wherein the voltage at the open drain of the cascode MOS transistor is supplied from the terminating voltage supply; and
   wherein the bias generator circuit is configured, in the absence of the integrated circuit voltage supply, to derive the bias voltage for application to the gate of the cascode MOS transistor from the voltage present at the open drain output obtained at the second supply voltage input from the terminating voltage supply.

2. The circuit of claim 1 wherein the bias generator circuit includes a first mode of operation responsive to presence of a voltage supplied from the integrated circuit voltage supply at the first supply voltage input to generate the bias voltage for application to the gate of the cascode MOS transistor derived from that voltage supplied from the integrated circuit voltage supply, and further includes a second mode of operation responsive to the absence of the voltage supplied from the integrated circuit voltage supply at the first supply voltage input to generate the bias voltage for application to the gate of the cascode MOS transistor derived from the voltage present at the open drain output of the cascode MOS transistor supplied from the terminating voltage supply.

3. A circuit comprising:
   a cascode MOS transistor having an open drain configured to be coupled through a first integrated circuit pad and terminating resistance to a terminating voltage supply and having a source node;
   a current switching device connected in series with the source node of the cascode MOS transistor;
   a bias generator circuit configured to generate a bias voltage for application to a gate of the cascode MOS transistor, the bias generator having a first supply voltage input configured to be coupled through a second integrated circuit pad to an integrated circuit voltage supply different from the terminating voltage supply and having a second supply voltage input coupled to receive a voltage at the open drain of the cascode MOS transistor;
   wherein the voltage at the open drain of the cascode MOS transistor is supplied from the terminating voltage supply;
   wherein the bias generator circuit is configured, in the absence of the integrated circuit voltage supply, to derive the bias voltage for application to the gate of the cascode MOS transistor from the voltage at the open drain obtained at the second supply voltage input from the terminating voltage supply; and
   wherein the bias generator circuit comprises:
      a first sourcing transistor coupled between the first supply voltage input and an output of the bias generator circuit for application of the bias voltage derived from the integrated circuit voltage supply to the gate of the cascode MOS transistor the integrated circuit; and
      a second sourcing transistor coupled between the second supply voltage input and the output of the bias generator circuit for application of the bias voltage derived from the voltage at the open drain of the cascode MOS transistor supplied at the second supply voltage input from the terminating voltage supply to the gate of the cascode MOS transistor the integrated circuit.

4. The circuit of claim 3 wherein the bias generator circuit further comprises a voltage divider circuit that divides the voltage at the open drain of the cascode MOS transistor to be passed by the second sourcing transistor as the bias voltage to the gate of the cascode MOS transistor the integrated circuit.

5. The circuit of claim 2 wherein the bias generator circuit further comprises a voltage sensing circuit configured to operate to sense the voltage supplied from the integrated circuit voltage supply at the first bias supply voltage input and drive switching between the first and second modes of operation in response thereto.

6. A circuit comprising:
   a cascode MOS transistor having an open drain configured to be coupled through a first integrated circuit pad and terminating resistance to a terminating voltage supply and having a source node;
   a current switching device connected in series with the source node of the cascode MOS transistor;
   a bias generator circuit configured to generate a bias voltage for application to a gate of the cascode MOS transistor, the bias generator having a first supply voltage input configured to be coupled through a second integrated circuit pad to an integrated circuit voltage supply different from the terminating voltage supply and having a second supply voltage input coupled to receive a voltage at the open drain of the cascode MOS transistor;
   wherein the voltage at the open drain of the cascode MOS transistor is supplied from the terminating voltage supply;
   wherein the bias generator circuit is configured, in the absence of the integrated circuit voltage supply, to derive the bias voltage for application to the gate of the cascode MOS transistor from the voltage at the open drain obtained at the second supply voltage input from the terminating voltage supply; and
   wherein the bias generator circuit comprises:
      an inverter circuit having an input coupled to the first supply voltage input and an output;
      a first sourcing transistor having a control terminal responsive to the output of the inverter circuit and having a first conduction path coupled between the first supply voltage input and an output of the bias generator circuit; and
      a second sourcing transistor having a control terminal responsive to the input of the inverter circuit and having a second conduction path coupled between the second supply voltage input and the output of the bias generator circuit.

7. The circuit of claim 6 wherein the bias generator circuit further comprises a voltage divider circuit powered from the second supply voltage input and having an output connected to the second conduction path of the second sourcing transistor, and wherein the inverter circuit is powered from the output of the voltage divider circuit.

8. The circuit of claim 7 wherein the inverter comprises first and second series connected transistors having a series conduction path coupled between the output of the voltage divider circuit and a reference voltage.

9. The circuit of claim 8 wherein the first and second series connected transistors have commonly connected control terminals coupled to the first supply voltage input.

10. A circuit, comprising:
an integrated circuit including a plurality of pads, the plurality of pads including an integrated circuit voltage supply pad configured to be coupled to an integrated circuit voltage supply and an open drain output pad configured to be coupled through a terminating resistance to a terminating voltage supply, the integrated circuit comprising:
a cascode transistor having a first conduction terminal coupled to the open drain output pad and having a second conduction terminal;
a current switching device connected in series with the second conduction terminal of the cascode transistor;
a bias generator circuit having an output coupled to a control terminal of the cascode transistor, the bias generator circuit having a first mode of operation wherein a bias signal at the output is derived from a first voltage supplied by the integrated circuit voltage supply at the integrated circuit voltage supply pad and further having a second mode of operation wherein the bias signal at the output is derived from a second voltage different from the first supply voltage and provided from the terminating voltage supply present at the open drain output pad.

11. The circuit of claim 10 wherein the first mode of operation utilizes a first sourcing transistor coupled between the integrated circuit voltage supply pad and the output of the bias generator circuit, and the second mode of operation utilizes a second sourcing transistor coupled between the open drain output pad and the output of the bias generator circuit.

12. The circuit of claim 11 wherein the bias generator circuit further comprises a voltage divider circuit that divides the voltage present at the open drain output pad for application to the second sourcing transistor.

13. The circuit of claim 11 wherein the bias generator circuit further comprises a voltage sensing circuit operating to sense presence of the first voltage present at the second pad and drive switching between the first and second modes of operation in response thereto.

14. The circuit of claim 11 wherein the bias generator circuit comprises:
a first sourcing transistor coupled between the integrated circuit voltage supply pad and an output of the bias generator circuit for application of the bias voltage derived from the integrated circuit voltage supply pad to the gate of the cascode MOS transistor the integrated circuit; and
a second sourcing transistor coupled between the open drain output pad and the output of the bias generator circuit for application of the bias voltage derived from the voltage present at the open drain output pad to the gate of the cascode MOS transistor the integrated circuit.

15. The circuit of claim 14 further comprising an inverter circuit having an input coupled to the integrated circuit voltage supply pad and an output coupled to the control terminal of the first sourcing transistor.

16. The circuit of claim 15 wherein the bias generator circuit further comprises a voltage divider circuit powered from the open drain output pad and having an output connected to the second conduction path of the second sourcing transistor, and wherein the inverter circuit is powered from the output of the voltage divider circuit.

17. The circuit of claim 16 wherein the inverter comprises first and second series connected transistors having a series conduction path coupled between the output of the voltage divider circuit and a reference voltage.

18. The circuit of claim 17 wherein the first and second series connected transistors have commonly connected control terminals coupled to the integrated circuit voltage supply pad.

* * * * *